United States Patent [19]

Miyakawa et al.

[11] 4,149,150
[45] Apr. 10, 1979

[54] DISPLAY DEVICE

[75] Inventors: Nobuaki Miyakawa, Hitachi; Masayuki Miki, Katsuta, both of Japan

[73] Assignee: Hitachi, Ltd., Japan

[21] Appl. No.: 784,812

[22] Filed: Apr. 5, 1977

[30] Foreign Application Priority Data

Apr. 9, 1976 [JP] Japan .................................. 51-39199

[51] Int. Cl.$^2$ .............................................. G06F 3/14
[52] U.S. Cl. ...................................... 340/754; 324/96; 340/803
[58] Field of Search ....... 340/347 AD, 324 R, 324 M, 340/336, 172; 324/96, 122

[56] References Cited

U.S. PATENT DOCUMENTS

| | | | |
|---|---|---|---|
| 3,133,278 | 5/1964 | Millis | 340/347 AD |
| 3,914,758 | 10/1975 | Ingle | 340/336 |
| 3,987,392 | 10/1976 | Kugelmann et al. | 340/172 |
| 4,006,412 | 2/1977 | Campbell et al. | 340/172 |
| 4,028,620 | 6/1977 | Kitagawa et al. | 340/172 |
| 4,040,719 | 8/1977 | Schiebelhuth | 340/336 |
| 4,040,721 | 8/1977 | Kurita | 340/336 |

Primary Examiner—Marshall M. Curtis
Attorney, Agent, or Firm—Craig & Antonelli

[57] ABSTRACT

A display device for displaying input analog quantities by lighting luminescent display elements, comprising an arithmetic circuit for dividing each of the input analog quantities into plural ranges and for amplifying each of the divided input quantities up to a predetermined level, a circuit for dividing the predetermined level into plural levels, comparison circuits each provided for the respective divided levels and for determining the lighting of the display elements by comparing the divided levels with a reference signal, a circuit for generating a clock signal for determining the timing of the lighting of the display elements, and drive circuits each connected between the respective comparison circuits and the respective display elements thereby for delivering effective voltages for lighting the display elements in response to the output signals of the comparison circuits and the clock signal, whereby resolution is improved over the whole ranges of the input analog quantities.

8 Claims, 7 Drawing Figures

DISPLAY DEVICE

BACKGROUND OF THE INVENTION

The present invention relates to a display device using liquid crystal display elements, for use in an instrument panel on a vehicle and more particularly to a display device which has improved resolution irrespective of the number of the display elements in the case where the velocity of a vehicle, r.p.m. of the engine, temperature, quantity of residual fuel and current are displayed by the lighting of display elements.

The conventional display device using liquid crystals has satisfactory resolution only when the number of liquid crystal elements therein is rather small, but if a relatively large number of liquid crystal elements are used, satisfactory resolution cannot be obtained for each comparision circuit so that the exact control of lighting of the elements is impossible. Moreover, the conventional display device is not preferable in the case where complementary MOS (CMOS) devices having high threshold levels are used as comparison circuits since in such a case the number of display elements capable of being lit is also limited.

SUMMARY OF THE INVENTION

One object of the present invention is to eliminate the drawbacks of a conventional display device.

Another object of the present invention is to provide a display device having high resolution.

According to a first aspect of the present invention, each of a number of input analog quantities is divided into plural ranges and the input quantity belonging to each of the plural ranges is amplified over a predetermined amplitude range, e.g., from minimum to maximum of the initial input analog quantity, to improve the resolution over the whole extent of the varying ranges of the input quantities.

According to a second aspect of the present invention, there is provided a display device for displaying input analog quantities by lighting luminescent display elements, comprising an input terminal for receiving the input analog quantities; a plurality of display elements for displaying the input analog quantities; an arithmetic circuit for dividing each of the input analog quantities into plural ranges and for amplifying each of the divided input quantities up to a predetermined level; a circuit for dividing the predetermined level into plural levels; comparison circuits each provided for the respective divided levels, for determining the lighting of the display elements by comparing the divided levels with a reference signal; a circuit for generating a clock signal for determining the timing of the lighting of the display elements; and drive circuits for deliverying effective voltages for lighting the display elements in response to the output signals of the comparison circuits and the clock signal.

According to a third aspect of the present invention, there is provided a display device for displaying input analog quantities by lighting luminescent display elements, comprising an input terminal for receiving the input analog quantities; a plurality of display elements for displaying the input analog quantities; first operational amplifiers each dividing each of the input analog quantities into plural ranges and amplifying each of the divided input quantities up to a predetermined level; voltage dividing circuits each provided for the respective plural ranges, for dividing each of the outputs of the first operational amplifiers into plural voltage levels; 2-input AND circuits for determining the lighting of the display elements by comparing the plural voltage levels with a reference voltage level; second operational amplifiers connected between the output terminals of the first operational amplifiers and the input terminals of the voltage dividing circuits, for offsetting the threshold voltages of the AND circuits; a circuit for generating a clock signal for determining the timing of the lighting of the display elements; and drive circuits connected between the output terminals of the AND circuits and the display elements, for delivering effective voltages for lighting the display elements in response to the output signals of the AND circuits and the clock signal.

DETAILED DESCRIPTION OF THE INVENTION

Figure 1A:
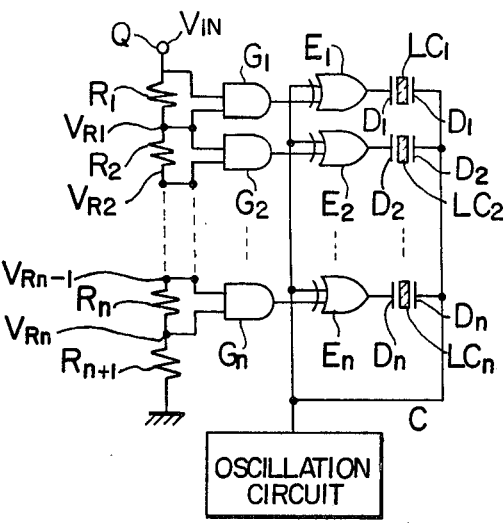
FIG. 1a shows a circuit of a display device disclosed in our co-pending U.S. patent application Ser. No. 768,346, filed on Feb. 14, 1977, entitled "A circuit for actuating a display with an improved comparator," used in the case where the number of display elements being used is relatively small.

The display device disclosed in the co-pending U.S. patent application Ser. No. 768,346 has a structure as shown in FIG. 1a. For a better understanding of the present invention, the display device shown in FIG. 1a will first be described.

In FIG. 1a, reference character Q designates an input terminal, character $R_1$ a resistor connected at its one end with the input terminal Q, character $R_2$ a resistor connected with the resistor $R_1$ at its one end and with another resistor $R_3$ at its other end. The resistor $R_n$ is connected at its one end with the resistor $R_{n-1}$; and the resistor $R_{n+1}$ connected at its one end with the resistor $R_n$ and grounded at its other end.

The operation of this circuit is as follows.

Let the input voltage at the input terminal Q be represented by $V_{in}$ and let the resistance values of the resistors $R_1$–$R_{n+1}$ be represented respectively by $r_1$–$r_{n+1}$. Then, the voltages $V_{R1}$–$V_{Rm}$ at the junction points of the resistors are given by the following expressions.

$$V_{R1} = \frac{r_2 + r_3 + \ldots + r_n + r_{n+1}}{r_1 + r_2 + \ldots + r_n + r_{n+1}} \cdot V_{in} \quad (1)$$

$$V_{R2} = \frac{r_3 + r_4 + \ldots + r_n + r_{n+1}}{r_1 + r_2 + \ldots + r_n + r_{n+1}} \cdot V_{in}$$

-continued
$$V_{R3} = \frac{r_4 + r_5 + \ldots + r_n + r_{n+1}}{r_1 + r_2 + \ldots + r_n + r_{n+1}} \cdot V_{in}$$

$$\vdots$$

$$V_{Rn} = \frac{r_{n+1}}{r_1 + r_2 + \ldots + r_n + r_{n+1}} \cdot V_{in}$$

Consequently, the input voltage $V_{in}$ is divided according to the resistance values of the respective resistors. In FIG. 1a, AND circuits $G_1$-$G_n$ each having two inputs serve as comparison circuits. The AND circuit $G_1$ has its two input terminals connected respectively with one end of the resistor $R_1$ and one end of the resistor $R_2$. The AND circuit $G_2$ has its two input terminals connected respectively with one end of the resistor $R_2$ and one end of the resistor $R_3$. In like manner, the j-th AND circuit $G_j$ has its two input terminals connected respectively with the resistors $R_j$ and $R_{j+1}$ and the n-th AND circuit $G_n$ has its two input terminals connected respectively with the resistors $R_n$ and $R_{n+1}$.

In this comparison circuit constituted of 2-input AND circuits, the operation of the j-th AND circuit $G_j$ is as follows.

In general, a digital element has a level (threshold level) at which the states of the element is switched over from one to another and if it is assumed that the threshold level of the j-th 2-input AND circuit $G_j$ is $V_L$ and that the input voltages at the input terminals are $V_{Rj}$ and $V_{Rj+1}$ ($V_{Rj} > V_{Rj+1}$), then the output level of the j-th AND circuit $G_j$ is "High" when $V_L < V_{Rj}, V_{Rj+1}$, but "Low" when $V_{Rj+1} < V_L < V_{Rj}$ or $V_L > V_{Rj}, V_{Rj+1}$. Accordingly, the output signal of the AND circuit $G_j$ is determined in accordance with the relationships among the values $V_{Rj}$ and $V_{Rj+1}$ given by the expressions (1) and the threshold level $V_L$.

Therefore, if the threshold levels of all the 2-input AND circuits $G_1$-$G_n$ are set to be a constant value, the voltages $V_{Rj}$ and $V_{Rj+1}$ are varied in accordance with the input voltage $V_{in}$ so that the output signals of the 2-input AND circuits $G_1$-$G_n$ can be sequentially changed in accordance with the relationships of $V_{Rj}$ and $V_{Rj+1}$ to the threshold level $V_L$.

In FIG. 1a, an oscillation circuit C for generating a clock signal determines the frequency for driving liquid crystal elements used as display elements. A driver circuits is constituted of exclusive OR circuits $E_1$-$E_n$. The exclusive OR circuit $E_1$ has its two input terminals connected respectively with the output terminal of the 2-input AND circuit $G_1$ and the output of the oscillation circuit C. The exclusive OR circuit $E_2$ has its two input terminals connected respectively with the output terminal of the 2-input AND circuit $G_2$ and the output terminal of the oscillation circuit C. Similarly, the j-th exclusive OR circuit $E_j$ has its two input terminals connected respectively with the output terminal of the j-th 2-input AND circuit $G_j$ and the output terminal of the oscillation circuit C. And the n-th exclusive OR circuit $E_n$ has its two input terminals connected respectively with the output terminal of the n-th exclusive OR circuit $E_n$ has its two input terminals connected respectively with the output terminal of the n-th 2-input AND circuit $G_n$ and the output terminal of the oscillation circuit C.

The operation of this circuit is as follows. The exclusive OR circuit delivers an output of "Low" level when its two digital input signals are at the same level (of the same phase) and an output of "High" level when the two input signals have different levels. Namely, each exclusive OR circuit delivers the output of "Low" level when the output signal of the associated 2-input AND circuit is in phase with the output signal of the oscillation circuit C, and the output of "High" level when the signals are opposite in phase to each other.

In FIG. 1a, members $D_1$-$D_n$, $LC_1$-$LC_n$ and $D'_1$-$D'_n$ constitute liquid crystal display elements. The electrodes $D_1$-$D_n$ of the liquid crystals $LC_1$-$LC_n$ are connected with the output terminals of the associated exclusive OR circuits $E_1$-$E_n$ and the electrodes $D'_1$-$D'_n$ of the liquid crystals $LC_1$-$LC_n$ are connected with the output terminal of the oscillation circuit C.

The operation of this circuit arrangement is as follows. The liquid crystal display elements are operated through the application of ac waveforms. Concerning the j-th liquid crystal $LC_j$ having electrodes $D_j$ and $D'_j$, when the output signal of the j-th exclusive OR circuit $E_j$ connected with the electrode $D_j$ is in phase with the output signal of the oscillation circuit C, that is, when the output signal of the j-th 2-input AND circuit $G_j$ has the "Low" level, the signal applied to the other electrode $D'_j$ is in phase with the output signal of the oscillation circuit C so that the liquid crystal $LC_j$ is not supplied with the effective voltage and the liquid crystal $LC_j$ is not lit.

On the other hand, when the output signal of the j-th exclusive OR circuit $E_j$ connected with the elecrode $D_j$ is opposite in phase to the output signal of the oscillation circuit C, that is, when the output of the j-th 2-input AND circuit $G_j$ is at the "High" level while the output of the oscillation circuit C is at the "Low" level, the signal supplied to the other electrode $D'_j$ is in phase with the output signal of the oscillation circuit C, i.e., at the "Low" level, the effective voltage is applied to the liquid crystal $LC_j$ to light it up.

Accordingly, in the comparison circuit, the divided voltages derived from the input voltage $V_{in}$ in accordance with the expression (1) are compared with the threshold voltages of the respective 2-input AND circuits and when the divided voltages applied to the two input terminals of each AND circuit are greater than the threshold voltage of the AND circuit, the effective voltage is applied to the liquid crystal display element associated with the AND circuit to light the liquid crystal while when one of the divided voltages is smaller than the threshold voltage, no effective voltage is applied to the liquid crystal so that the liquid crystal is not lit.

Figure 1B:
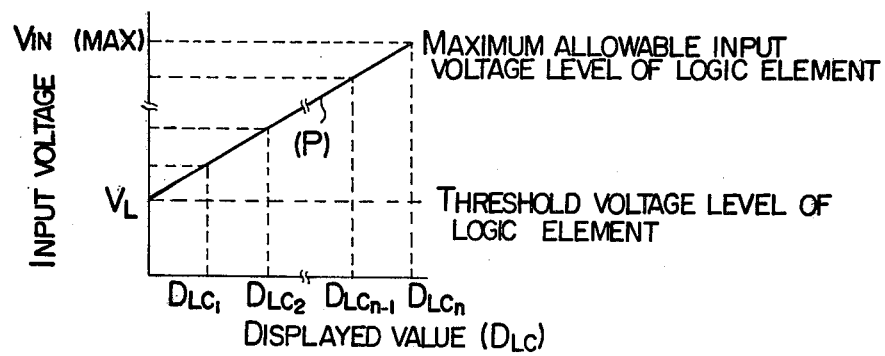
FIG. 1b illustrates the relationship between the input voltage of the display device and the values to be displayed by lighting the liquid crystal elements of the display elements.

FIG. 1b shows the relationship between the input voltage and the values to be displayed when the liquid crystals are lit.

In FIG. 1b, reference characters $D_{LC1}$-$D_{LCn}$ may represent, for example, the levels of the input voltage displayed by the lighting of the respective liquid crystal display elements. The same threshold voltage of all the 2-input AND circuits, i.e., the reference voltage level of the comparison circuit, is indicated by the reference character $V_L$, which is 45-50% of the power source voltage in the case of, for example, AND gates.

The above description is given to the display device disclosed in the co-pending application with the present invention. With the circuit configuration described above, if there are used a relatively small number of liquid crystal display element to be lit, resolution is satisfactory for all the values to be displayed with respect to the range of the input voltage. However, if a comparatively large number of such elements are used, resolution for the respective comparison circuits is not sufficient so that the exact control of the lighting of the display elements is impossible. The reason for this is that since for a greater number of display elements the threshold level of the logic element, e.g., AND gates, serving as comparison circuits fluctuates within a range of at least 5% as described above, the maximum input level is limited by the maximum allowable input voltages of the logic elements. Moreover, with this circuit configuration, the use of complementary MOS (CMOS) devices having a high threshold level as comparison circuits would further limit, that is, decrease the number of display elements in order to keep the resolution unchanged.

Figure 2:
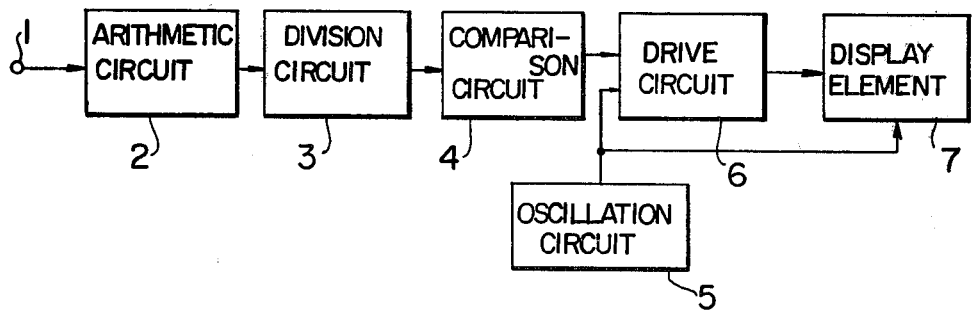
FIG. 2 shows in block diagram a circuit of a display device according to the present invention.

FIG. 2 is a block diagram of the circuit configuration of a display device according to the present invention. In FIG. 2, reference numeral 1 indicates an input terminal of the display device; 2 an arithmetic circuit for dividing the input analog quantity of the display device into plural ranges and for amplifying the divided quantities up to predetermined levels; 3 a division circuit for further dividing the output of the arithmetic circuit 2 belonging to each range into plural subranges; 4 comparison circuits each provided for the respective display elements (e.g., liquid crystal device) so as to determine the lighting of the corresponding display elements by comparing the subdivision levels of the division circuit 3 with the reference signal; 5 an oscillation circuit for generating a clock signal applied to the display elements for determining the lighting timing of the display elements; 6 a drive circuit for determining the selective lighting of the display elements on the basis of the output signals of the comparison circuits 4 and the output of the oscillation circuit 5 and for supplying the display elements with the effective voltage for lighting them up; and 7 display elements for being lit in response to the output signals of the oscillation circuit 5 and the drive circuit 6.

Figure 3:
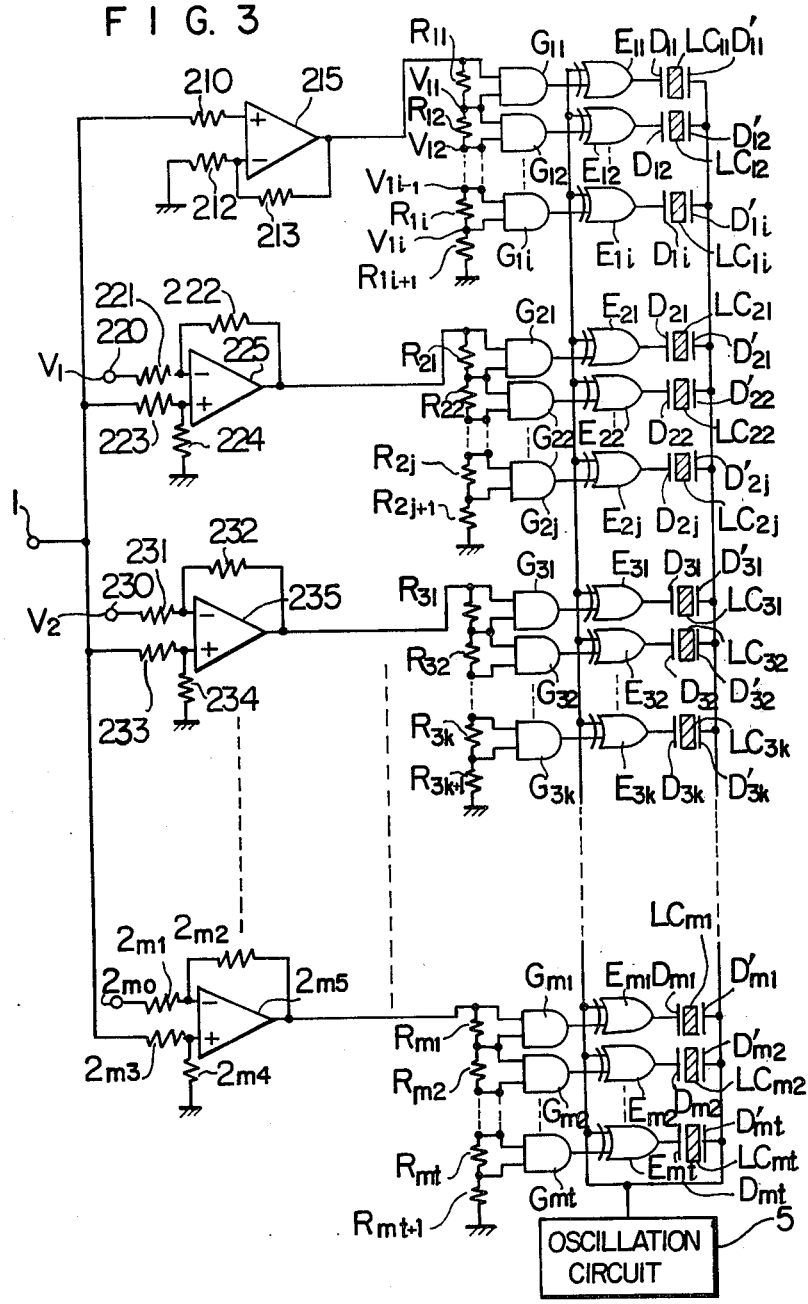
FIG. 3 shows a circuit of a display device as an embodiment of the present invention.

FIG. 3 shows a concrete example of the preferred embodiment of the present invention shown in the block diagram of FIG. 2. In FIG. 3, reference numeral 1 designates an input terminal of the display device as the embodiment of the present invention; 210 a resistor with its one end connected with the input terminal; 215 an operational amplifier with its non-inverting input terminal connected with the other end of the resistor 210; 212 a resistor with its one end grounded and the other end connected with the inverting input terminal of the operational amplifier 215; 213 a resistor with its ends connected respectively with the inverting input terminal and the output of the operational amplifier 215. The constitution so far described is a first section for identifying the first division range and for generating the varying voltage belonging to the first division range.

The operation of the first section is as follows.

Let the input voltage be represented by $V_{in}$ and let the resistance values of the resistors 212 and 213 be denoted by $R_{212}$ and $R_{213}$, respectively. Then, it follows for the non-inverting and inverting input terminals of the operations amplifier 215 that $$V_+ = V_{in} \qquad (2)$$

for the non-inverting input terminal, and $$V_- = \frac{R_{212}}{R_{212} + R_{213}} \cdot V_{215out} \qquad (3)$$

for the inverting input terminal.

Here, $V_{30}$, $V_-$ and $V_{215out}$ designate the non-inverting input voltage, the inverting input voltage and the output voltage of the operational amplifier 215, respectively.

Therefore, $V_{215out}$ is related to $V_{in}$ by the following equation, as seen from the expressions (2) and (3).

$$V_{215out} = (1 + \frac{R_{213}}{R_{212}}) V_{in} \qquad (4)$$

Consequently, it is seen from (4) that the output of the operational amplifier 215 is an amplified version of the input voltage applied to the amplifier.

Figure 4:
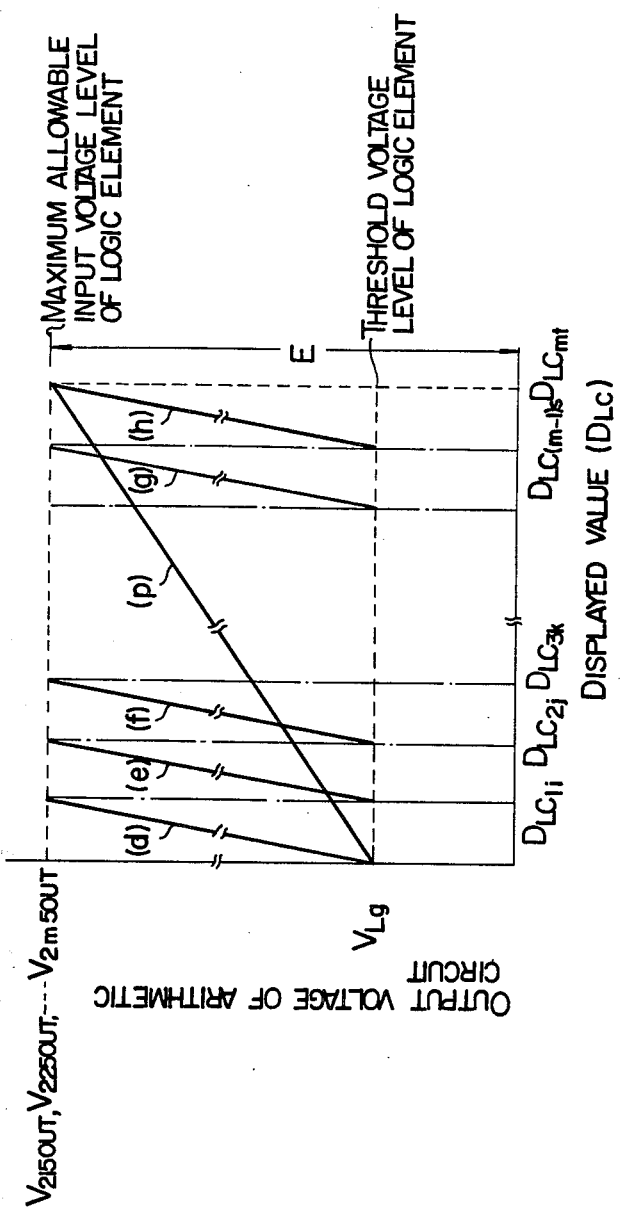
FIG. 4 illustrates the relationship between the output voltages of the operational amplifiers and the values to be displayed by lighting the liquid crystals elements, in the display device shown in FIG. 3.

The output signal of the operational amplifier 215 generated by the elements 210–215 is shown by letter (d) in FIG. 4.

In FIG. 3, element 220–225 constitute a second section for identifying the second division range and for generating the varying voltage belonging to the second division range. Reference numeral 220 designates an input terminal for receiving a voltage to distinguish between the first and second division ranges; 221 a resistor with its one end connected with the input resistor 220, 222 a resistor with its one end connected with the other end of the resistor 221; 223 a resistor with its one end connected with the input terminal 1; 224 a resitor with its one end connected with other end of the resistor 223 and with its remaining end gounded; and 225 an operational amplifier with its non-inverting input terminal, inverting input terminal and output terminal connected respectively with the other ends of the resistors 223, 221 and 222.

The operation of the second section is as follows. Let the input voltage at the input terminal 220, the resistance values of the resistors 221 and 222, and the voltage at the inverting input terminal of the operational amplifier 225 be denoted respectively by $V_1$, $R_{221}$, $R_{222}$ and $V_{225-}$. Then, it follows for the inverting input terminal that $$\frac{V_1 - V_{225-}}{R_{221}} = \frac{V_{225-} - V_{225out}}{R_{222}} \qquad (5)$$

Solution of (5) for $V_{225-}$ yields $$V_{225-} = \frac{R_{221} \cdot V_{225out} + R_{222} \cdot V_1}{R_{221} + R_{222}} \qquad (6)$$

, where $V_{225out}$ is the output voltage of the operational amplifier 225.

On the other hand, let the input voltage at the input terminal 1, the resistance values of the resistors 223 and 224, and the input voltage at the non-inverting input terminal of the operational amplifier 225 be denoted respectively by $V_{in}$, $R_{223}$ $R_{224}$ and $V_{225+}$. Then, it follows for the non-inverting input terminal that $$V_{225+} = \frac{R_{224}}{R_{223} + R_{224}} \cdot V_{in} \qquad (7)$$

Accordingly, the following expression (8) is obtained by equating the left-hand sides of the expressions (6) and (7) in accordance with the condition for stability of the operational amplifier 225.

$$\frac{R_{221}V_{225out} + R_{222}V_1}{R_{221} + R_{222}} = \frac{R_{224}}{R_{223} + R_{224}} V_{in} \qquad (8)$$

Solution for the output voltage $V_{225out}$, with the condition that $R_{221}=R_{223}=R_{22}$ and $R_{222}=R_{224}=R_{22A}$, yields $$V_{225out} = \frac{R_{22A}}{R_{22}} (V_{in} - V_1) \qquad (9)$$

Since the amplification factor in (9) is determined depending on the resistance values $R_{22}$ and $R_{22A}$ and since the quantity $(V_{in}-V_1)$ is amplified to be $V_{225out}$, the output voltage $V_{225out}$ is delivered only after $V_{in}$ has exceeded $V_1$.

The output voltage of the operational amplifier 225 generated by the elements 220–225 is denoted by (e) in FIG. 4.

In FIG. 3, elements 230–235 constitute a third section for identifying the third division range and for generating the varying voltage belonging to the third range. Reference numeral 230 designates an input terminal for receiving a voltage to distinguish between the second and third ranges; 231 a resistor with its one end connected with the input terminal 230; 232 a resistor with its one end connected with the other end of the resistor 231; 233 a resistor with its one end connected with the input terminal 1, 234 a resistor with its one end connected with the other end of the resistor 233 and with its remaining end grounded; and 235 an operational amplifier with its inverting and non-inverting input terminals and its output terminal connected respectively with the other ends of the resistors 231, 233 and 232.

The operation of the third section is similar to that of the first or second section, and it follows that $$V_{235out} = \frac{R_{23A}}{R_{23}} (V_{in} - V_2) \qquad (10)$$

, where $V_{235out}$ is the output voltage of the operational amplifier 235, $R_{23}$ and $R_{23A}$ are such that $R_{231}=R_{232}=R_{23}$ and $R_{232}=R_{234}=R_{23A}$, and $V_2$ is a voltage for distinguishing the second and third ranges.

The output signal of the operational amplifier 235 generated by the elements 230–235 is denoted by letter (f) in FIG. 4.

The arithmetic circuit 2 shown in FIG. 2, for dividing the input into plural ranges, is constituted of a plurality of such sections described above.

Therefore, concerning the section for identifying the m-th division range and for generating the varying voltage belonging to the m-th range, it follows that $$V_{2m5out} = \frac{R_{2mA}}{R_{2m}} (V_{in} - V_{m-1}) \qquad (11)$$

The output of the operational amplifier 2m5 generated by the elements 2m0–2m5 is denoted by letter (h) in FIG. 4.

Consequently, with the constitution described above, the input voltage indicated by letter (p) in FIG. 1b and FIG. 4 is converted into the voltages indicated by letters (d)–(f) in FIG. 4 so that resolution is equivalently improved.

The voltages E in FIG. 4 can be set with a relatively large degree of freedom. It may be chosen to be equal to the maximum value of the input voltage, the power source voltage, or a certain constant value.

In FIG. 3, $R_{11}$-$R_{1i+1}$, $R_{21}$-$R_{2j+1}$, $R_{21}$-$R_{2k+1}$, ..., $R_{ml}$-$R_{mt+1}$ are resistors constituting voltage division circuits for further dividing the input voltage so as to generate voltage levels used to determine the lighting of display elements within the respective divided ranges, resistors $R_{11}$, $R_{21}$, $R_{31}$, ..., $R_{m+1}$ being connected respectively with the output terminals of the operational amplifier 215, 225, 235, ..., 2m5.

The voltage division circuits will be described with the first voltage division circuit constituted of the resistors $R_{11}$-$R_{1i+1}$ taken as an example. Reference character $R_{11}$ indicates a resistor with its one end connected with the output terminal of the operational amplifier 215; $R_{12}$ a resistor with its one end connected with the resistor $R_{11}$; ...; $R_{1i}$ a resistor with its ends connected with the resistors $R_{1i-1}$ and $R_{1i+1}$; and $R_{1i+1}$ a resistor with its one end connected with the resistor $R_{1i}$ and with its remaining end grounded.

The operation of the voltage division circuit is as follows.

The output signal of the operational amplifier 215 is $V_{215out}$ given by the expression (4) and if the resistors $R_{11}$-$R_{1i+1}$ have resistance values $r_{11}$-$r_{1i+1}$, respectively, the voltages $V_{11}$-$V_{1i}$ at the junction points of the resistors are given by the following expressions.

$$V_{11} = \frac{r_{12} + r_{13} + \ldots + r_{1i} + r_{1i+1}}{r_{11} + r_{12} + r_{13} + \ldots + r_{1i} + r_{1i+1}} V_{215out} \qquad (12)$$

$$V_{12} = \frac{r_{13} + r_{14} + \ldots + r_{1i} + r_{1i+1}}{r_{11} + r_{12} + r_{13} + \ldots + r_{1i} + r_{1i+1}} V_{215out}$$

$$\vdots$$

$$V_{1i} = \frac{r_{1i+1}}{r_{11} + r_{12} + r_{13} + \ldots + r_{1i} + r_{1i+1}} V_{215out}$$

As seen from the expressions (12), the voltage division circuit divides $V_{215}$ as the input voltage to the circuit, in accordance with the resistance values.

In FIG. 3, $G_{11}$-$G_{1i}$, $G_{21}$-$G_{2j}$, $G_{31}$-$G_{3k}$, ..., and $G_{ml}$-$G_{mt}$ designate 2-input AND circuits serving as comparison circuits for determining the lighting of display elements within the respective divided ranges.

The comparison circuits will be typified below by the circuit constituted of 2-input AND circuits $G_{11}$-$G_{1i}$. The 2-input AND circuit $G_{11}$ has its input terminals connected with the resistors $R_n$ and $R_{12}$; the 2-input AND circuit $G_{12}$ has its input terminals connected with the resistors $R_{12}$ and $R_{13}$; and likewise the 2-input AND circuit $G_{1i}$ has its input terminals connected with the resistors $R_{1i}$ and $R_{1i+1}$.

The operation of this comparison circuit is as follows. Now, let the threshold voltage of the q-th 2-input AND circuit $G_{1q}$ be $V_{Lq}$ and let the input voltages at the two input terminals be respectively $V_{1q}$ and $V_{1q+1}$ ($V_{1q}>V_{1q+1}$). Then, the output level of the AND circuit $G_{1q}$ is "High" when $V_{Lq}<V_{1q}$, $V_{1q+1}$, and "Low" when $V_{1q+1}<V_{Lq}<V_{1q}$ or $V_{Lq}>V_{1q}$, $V_{1q+1}$. Therefore, the output of the AND circuit $G_{1q}$ is determined in accordance with the relationship of the threshold voltage $V_{Lq}$ to the voltages $V_{1q}$ and $V_{1q+1}$ given by the expressions (12).

Therefore, if the threshold levels of all the 2-input AND circuits $G_{11}$-$G_{1i}$ are set equal to a constant value, $V_{1q}$ and $V_{1q+1}$ vary in accordance with the output voltage $V_{215out}$ so that the output signals of the 2-input AND circuits $G_{11}-G_{1i}$ can be sequentially changed in accordance with the relationship of $V_{Lq}$ to $V_{1q}$ and $V_{1q+1}$.

In FIG. 3, reference numeral 5 indicates an oscillation circuit for generating a clock signal to be applied to liquid crystal display elements.

In FIG. 3, $E_{11}-E_{1i}$, $E_{21}-E_{2j}$, $E_{31}-E_{3k}$, . . ., and $E_{ml}-E_{mt}$ denote exclusive OR circuits serving as liquid crystal drive circuits for receiving the outputs of the 2-input AND circuits $G_{11}-G_{1i}$, $G_{21}-G_{2j}$, $G_{31}-G_{3k}$, . . ., and $G_{ml}-G_{mt}$ and the output of the oscillation circuit 5 so as to determine the conditions for lighting the liquid crystal display elements and for delivering the effective voltages to be applied to the liquid crystal display elements.

The liquid crystal drive circuits will be typified below by the circuit constituted of exclusive OR circuits $E_{11}-E_{1i}$. The exclusive OR circuit $E_{11}$ has its two input terminals connected with the output terminal of the 2-input AND circuit $G_{11}$ and the output terminal of the oscillation circuit 5; the exclusive OR circuit $E_{12}$ has its two input terminals connected with the output terminal of the 2-input AND circuit $G_{12}$ and the output terminal of the oscillation circuit 5; and likewise the i-th exclusive OR circuit $E_{1i}$ has its two input terminals connected with the output terminal of the i-th 2-input AND circuit $G_{1i}$ and the output terminal of the oscillation circuit 5.

The operation of the liquid crystal drive circuit is as follows.

The operation of each of the exclusive OR circuits $E_{11}-E_{1i}$ is determined by the input signals to its two input terminals. The exclusive OR circuit $E_{11}$ delivers an output signal of "Low" level when the two input signals are in phase with each other and an output signal of "High" level when the two input signals are opposite in phase to each other. Accordingly, the output signals of the exclusive OR circuits $E_{12}-E_{1i}$ are at the "Low" level when the output signals of the corresponding 2-input AND circuits $G_{12}-G_{1i}$ are in phase with the output signal of the oscillation circuit 5 and at the "High" level when the output signals of the circuits $G_{12}-G_{1i}$ are opposite in phase to the output of the oscillation circuit 5.

In FIG. 3, members $D_{11}-D_{1i}$, $D_{21}-D_{2j}$, $D_{31}-D_{3k}$, . . . , $D_{ml}-D_{mt}$, $LC_{11}-LC_{1i}$, $LC_{21}-LC_{2j}$, $LC_{31}-LC_{3k}$, . . . , $LC_{ml}-LC_{mt}$, $D'_{11}-D'_{1i}$, $D'_{21}-D'_{2j}$, $D'_{31}-D'_{3k}$, . . ., and $D'_{ml}-D'_{mt}$ constitute liquid crystal display elements.

The constitutions and functions of the liquid crystal display elements will be described below with the elements constituted of the members $D_{11}-D_{1i}$, $LC_{11}-LC_{1i}$, and $D'_{11}-D'_{1i}$ taken as examples. Reference characters $D_{11}-D_{1i}$ designates the electrodes of liquid crystal display elements connected with the corresponding output terminals of the exclusive OR circuits $E_{11}-E_{1i}$ while characters $D'_{11}-D'_{11}$ indicate the electrodes of the liquid crystal display elements connected with the output terminal of the oscillation circuit 5. Liquid crystals are denoted by $LC_{11}-LC_{1i}$.

The operation of this constitution is as follows.

The operation of the liquid crystal display element constituted of the members $D_{11}$, $LC_{11}$ and $D'_{11}$ is as follows. The clock signal is applied to the liquid crystal display elements and the amplitude of the effective voltage determines whether the liquid crystal display element is lit or not.

When the output signal of the exclusive OR circuit $E_{11}$ supplied to the electrode $D_{11}$ is in phase with the output signal of the oscillation circuit 5, that is, when the output signal of the 2-input AND circuit $G_{11}$ is at the "Low" level, the signal applied to the electrode $D'_{1}$ is in phase with the output signal of the oscillation circuit 5. Accordingly, the effective voltage is not applied to the liquid crystal $LC_{11}$ so that the liquid crystal $LC_{11}$ is not lit.

On the other hand, when the output signal of the exclusive OR circuit $E_{11}$ supplied to the electrode $D_{11}$ is opposite in phase to the output signal of the oscillation circuit 5, that is, when the output signal of the 2-input AND circuit $G_{11}$ is at the "High" level, the signal applied to the electrode $D'_{11}$ is in phase with the output of the oscillation circuit 5 so that the liquid crystal $LC_{11}$ is supplied with the effective voltage for lighting it up.

FIG. 4 shows the output characteristic of the arithmetic circuit 2 as an embodiment of the present invention, the portions indicated by letters (d)-(h) being obtained from the arithmetic circuit 2 and connecting the ranges capable of being arithmetically operated.

Therefore, the arithmetic circuit 2 converts the linear variation of the input voltage $V_{in}$ into a saw-tooth waveform. Here, E designates the maximum value of the output signal obtained as a result of aritmetic operation.

Moreover, the outputs of the arithmetic circuit 2 is increased up to E at the end of the respective varying ranges so as to smoothly calculate the increment or decrement in the output signal.

Figure 5:
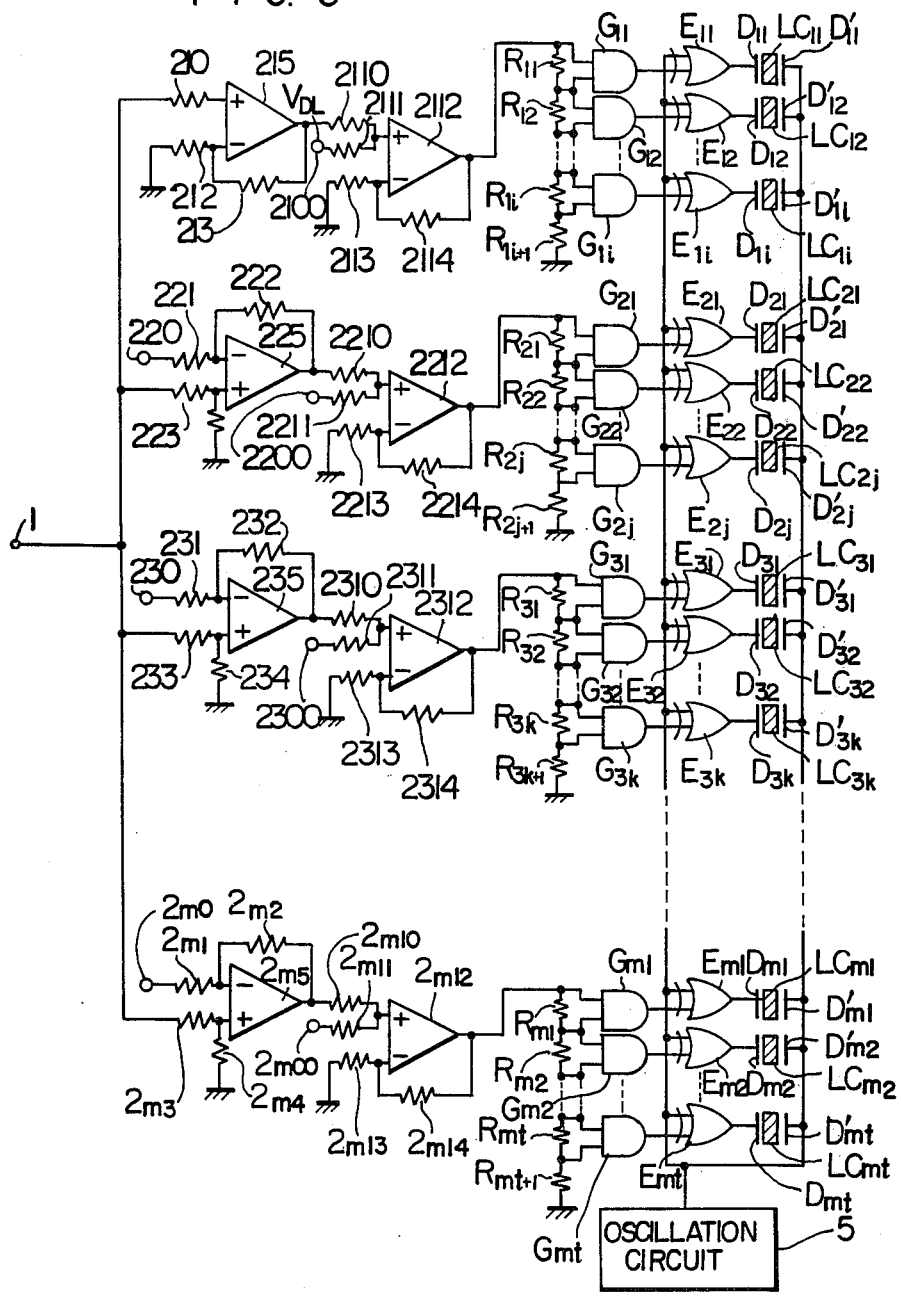
FIG. 5 shows a circuit of a display device as another embodiment of the present invention.

FIG. 5 shows another embodiment of the present invention, in which digital elements used as comparison circuits have a high threshold voltage, that is, the digital elements are CMOS devices.

In such a case, it is only necessary to add to the circuit configuration of the arithmetic circuit 2 shown in FIG. 3 summing mechanisms 2100, 2110-2114, 2200, 2210-2214, 2300, 2310-2314, . . ., 2m00, and 2m10-2m14, as shown in FIG. 5. Namely, the range of arithmetic operation is broadened by the use of the mechanisms by each of which a voltage exactly or nearly equal to the threshold voltage of the corresponding digital element is always added.

The additional circuits will be described with the section constituted of the members 2100, and 2110-2114 taken as an example.

An input terminal 2100 receives a voltage exactly or nearly equal to the threshold voltage of the corresponding digital element used as a comparison circuit. A resistor 2110 is connected at its one end with the output terminal of the operational amplifier 211, a resistor 2111 is connected at its one end with the input terminal 2100, an operational amplifier 2112 has its non-inverting input terminal connected with the other ends of the resistors 2110 and 2111, a resistor 2113 is connected at its one end with the inverting input terminal of the operational amplifier 2112 and grounded at its other end, and a resistor 2114 is connected between the inverting input terminal and the output terminal of the operating amplifier 2112.

The operation of the combination of the parts 2110-2114 is as follows.

Let the input voltage at the input terminal 2100 be $V_{Dl}$ and let the resistance values of the resistors 2110, 2111, 2113 and 2114 be respectively $R_{2110}$, $R_{2111}$, $R_{2113}$ and $R_{2114}$. Then, the input voltages $V_{2112+}$ and $V_{2112-}$ at the non-inverting and inverting input terminals of the operational amplifier 2112 are given by the following expressions.

$$V_{2112+} = V_{215out} + V_{DL} \quad (13)$$

$$V_{2112-} = \frac{R_{2113}}{R_{2113} + R_{2114}} V_{2112out} \quad (14)$$

, where $V_{2112out}$ is the output signal of the operational amplifier 2112.

As seen from the expressions (13 and (14). $V_{2112out}$ is related to $(V_{215out} + V_{DL})$ by the following equation.

$$V_{2112out} = (1 + \frac{R_{2114}}{R_{2113}})(V_{215out} + V_{DL}) \quad (15)$$

Figure 6:
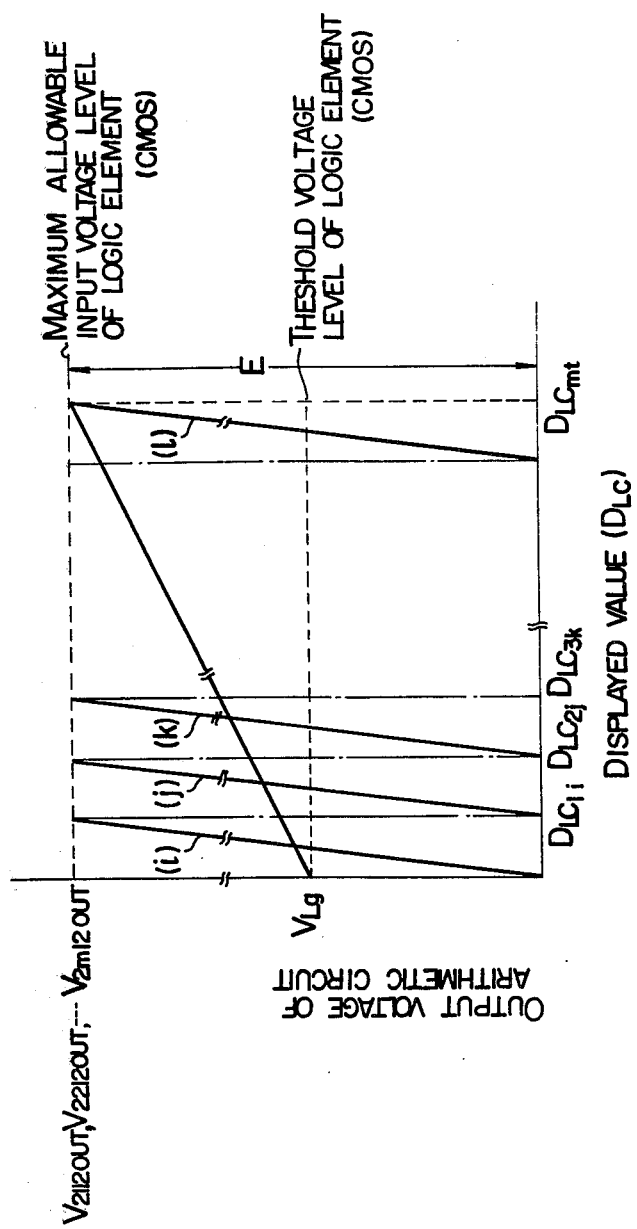
FIG. 6 illustrates the relationship between the output voltages of the operational amplifiers and the values to be displayed by lighting the liquid crystal elements, in the display device shown in FIG. 5.

Therefore, the output of the arithmetic circuit 2 is increased by the threshold voltage of the digital element. Consequently, the waveforms indicated by letters (i), (j), (k) and (l) in FIG. 6 represent the output voltages $V_{2112out}$, $V_{2212out}$, $V_{2312out}$ and $V_{2ml2out}$, respectively.

The display device described above enjoys the following effects.

(1) The varying range of the input voltage can be made small and satisfactory resolution can be attained even in the case where a large number of liquid crystal display elements are used.

(2) Satisfactory resolution can be obtained no matter what kind of digital element may be used as a comparison circuit, and the liquid crystal display elements can be uniformly controlled.

The display device according to the present invention can be applied not only to the case where the input voltage increases, but also to the case where the input voltage decreases.

Moreover, according to the present invention, the display of what percent each input voltage is of the maximum input voltage, is possible irrespective of the number of liquid crystal display elements to be used and the varying range of the input voltage so that many display items such as velocity, r.p.m., etc., of an automobile can be displayed with satisfactory accuracy.

We claim:

1. A display device for displaying input analog quantities by lighting luminescent display elements, comprising an input terminal for receiving said input analog quantities; a plurality of display elements for displaying said input analog quantities; an arithmetic circuit for dividing each of said input analog quantities into plural ranges and for amplifying each of said divided input quantities up to a predetermined level; a circuit for dividing said predetermined level into plural levels; comparison circuits each provided for said respective divided levels, for determining the lighting of said display elements by comparing said divided levels with a reference signal; a circuit for generating a clock signal for determining the timing of the lighting of said display elements; and drive circuits each connected between said respective comparison circuits and said respective display elements, for delivering effective voltages for lighting said display elements in response to the output signals of said comparison circuits and said clock signal.

2. A display device as claimed in claim 1, wherein said arithmetic circuit has first operational amplifiers each provided for said respective ranges and each of said input analog quantities is divided into plural voltage ranges by applying predetermined voltages to the inverting input terminals of said first operational amplifiers.

3. A display device as claimed in claim 1, wherein each of said comparison circuits is a logic circuit and said arithmetic circuit has first and second operational amplifiers provided respectively for said respective ranges, and wherein each of said input analog quantities is divided into plural voltage ranges by applying predetermined voltages to the inverting input terminals of said first operational amplifiers and the output voltages of said first operational amplifiers and the predetermined voltages equal to the threshold levels of said logic circuits are applied respectively to the non-inverting input terminals of said second operational amplifiers.

4. A display device as claimed in claim 3, wherein said logic circuit is a 2-input AND circuit.

5. A display device as claimed in claim 3, wherein said logic circuit is a 2-input NAND circuit.

6. A display device as claimed in claim 1, wherein said drive circuit is an exclusive OR circuit.

7. A display device as claimed in claim 1, wherein said display element is a liquid crystal device.

8. A display device as claimed in claim 1, wherein said display element is a light-emitting diode.

* * * * *